(12) United States Patent
Wang et al.

(10) Patent No.: US 10,483,451 B2
(45) Date of Patent: Nov. 19, 2019

(54) VIBRATION DEVICE

(71) Applicant: AAC Technologies Pte, Ltd., Singapore (SG)

(72) Inventors: Wenli Wang, Shenzhen (CN); Hongfu Xu, Shenzhen (CN); Fanghua Ling, Shenzhen (CN); Yongsheng Lu, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 283 days.

(21) Appl. No.: 15/650,943

(22) Filed: Jul. 16, 2017

(65) Prior Publication Data

US 2018/0301615 A1  Oct. 18, 2018

(30) Foreign Application Priority Data

Apr. 14, 2017 (CN) .................... 2017 2 0393337 U

(51) Int. Cl.
| | |
|---|---|
| *H01L 41/09* | (2006.01) |
| *H01L 41/04* | (2006.01) |
| *H01L 41/18* | (2006.01) |
| *H01L 41/22* | (2013.01) |
| *H03B 5/32* | (2006.01) |
| *H01L 41/00* | (2013.01) |

(52) U.S. Cl.
CPC ............. *H01L 41/04* (2013.01); *H01L 41/09* (2013.01); *H01L 41/18* (2013.01); *H01L 41/22* (2013.01); *H03B 5/32* (2013.01); *H01L 41/00* (2013.01)

(58) Field of Classification Search
CPC ......... H01L 41/04; H01L 41/09; H01L 41/18; B06B 1/045
See application file for complete search history.

(56) References Cited

U.S. PATENT DOCUMENTS

| | | | | |
|---|---|---|---|---|
| 7,671,493 | B2* | 3/2010 | Takashima | B06B 1/045 310/12.16 |
| 7,825,742 | B2* | 11/2010 | Lee | H03L 1/04 331/158 |
| 8,288,898 | B2* | 10/2012 | Jun | H02K 33/16 310/13 |
| 9,762,110 | B2* | 9/2017 | Wang | H02K 33/16 |
| 2005/0121984 | A1* | 6/2005 | Nakamura | H02K 33/06 310/12.03 |

(Continued)

*Primary Examiner* — J. San Martin
(74) *Attorney, Agent, or Firm* — IPro, PLLC; Na Xu

(57) ABSTRACT

A vibration device, including a housing having accommodating space, a vibrator, a stator and an elastic member for making the vibrator suspended in the accommodating space, the vibrator, the stator and the elastic member are accommodated in the housing, one of the vibrator and the stator includes a magnetic circuit unit while the other one includes a coil, the housing includes a pair of first side walls symmetrically arranged in a long axis direction of the housing and a pair of second side walls symmetrically arranged in a short axis direction, the elastic member includes a sheet-like spring perpendicular to vibrating direction of the vibrator, the spring includes a first fixing portion fixedly connected with the housing, a second fixing portion fixedly connected with the vibrator, and an N-shaped connecting portion connects the first fixing portion with the second fixing portion and extends along the short axis direction.

8 Claims, 2 Drawing Sheets

(56) References Cited

U.S. PATENT DOCUMENTS

| | | | |
|---|---|---|---|
| 2010/0213773 A1* | 8/2010 | Dong | H02K 33/16 310/25 |
| 2011/0006618 A1* | 1/2011 | Lee | B06B 1/045 310/25 |
| 2011/0018364 A1* | 1/2011 | Kim | H02K 33/18 310/17 |
| 2011/0018365 A1* | 1/2011 | Kim | B06B 1/045 310/17 |
| 2011/0204732 A1* | 8/2011 | Miyamoto | H02K 33/16 310/25 |
| 2011/0266892 A1* | 11/2011 | Wauke | B06B 1/045 310/25 |
| 2011/0280433 A1* | 11/2011 | Park | H02K 33/16 381/433 |
| 2011/0316361 A1* | 12/2011 | Park | H02K 33/16 310/25 |
| 2012/0049660 A1* | 3/2012 | Park | B06B 1/045 310/25 |
| 2012/0169151 A1* | 7/2012 | Dong | H02K 33/16 310/25 |
| 2012/0187780 A1* | 7/2012 | Bang | H02K 33/16 310/25 |
| 2018/0297062 A1* | 10/2018 | Huang | B06B 1/045 |

\* cited by examiner

VIBRATION DEVICE

TECHNICAL FIELD

The present disclosure relates to the field of electronic devices and, particularly, to a vibration device.

BACKGROUND

With the development of electronic technologies, portable consumption electronic product such as cellphone, handheld game player, navigation device or handheld multimedia entertainment device and the like is becoming more and more popular. Generally, these electronic products will use a vibration device for system feedback such as call prompt, message prompt, navigation prompt of a cellphone, and vibration feedback of a game player, etc.

The existing vibration device includes a housing, a stator and a vibrator. The stator and the vibrator are accommodated in the housing. The stator includes a main magnet and a magnetic conductor accommodating the main magnet. A spring is also provided in the housing. The existing spring is of an S-shaped structure, two ends of the S-shaped spring are respectively welded on the vibrator and the housing, and the elastic deformation direction of the spring is the same as the vibration direction of the vibrator. In a vibration device having such a structure, the structure of the spring is complicated and difficult to process, and the elastic deformation direction of the spring is perpendicular to the welding surface between the vibrator and the spring. Therefore, a welding area between the vibrator and the spring may not be easily shaped, which brings difficulty during assembling.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

In order to make the purpose, technical solution and advantage of the present disclosure more clearly, the embodiments of the present disclosure will be described in detail with reference to the accompanying drawings. However, it can be understood by those skilled in the art that, in various embodiments of the present disclosure, a plurality of technical details has been presented in order to help readers to better understand the present disclosure. However, even without these technical details, or any variations or modifications based on the following embodiments, the technical solution protected by the claims of the present disclosure can still be implemented.

Figure 1:
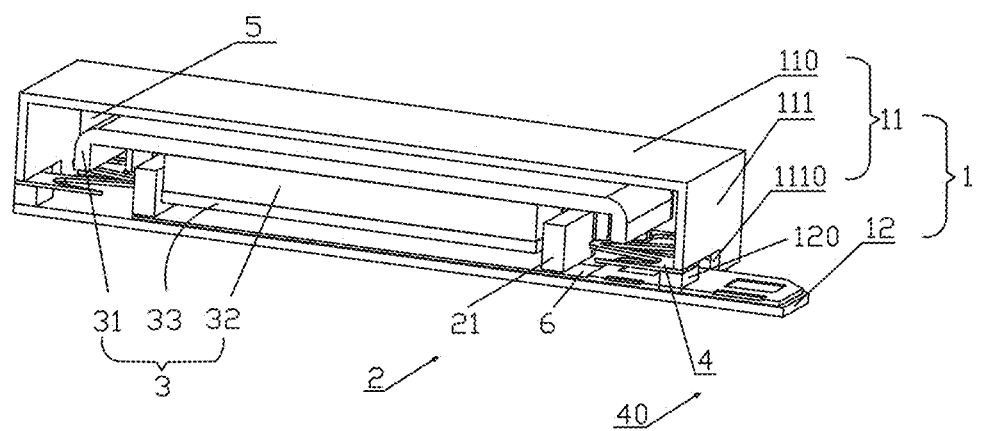
FIG. 1 is a sectional structural schematic view of a vibration device in accordance with an exemplary embodiment of the present disclosure.
Figure 2:
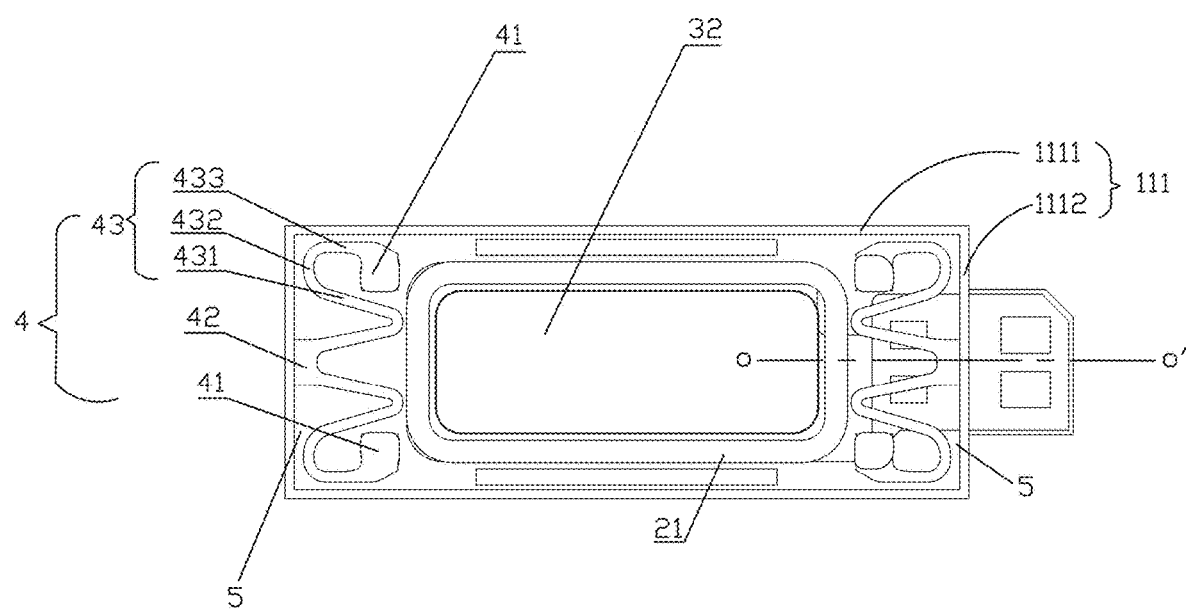
FIG. 2 is a schematic view of an assembled structure of a magnetic circuit unit, a housing and an elastic member of a vibration device in accordance with an exemplary embodiment of the present disclosure.

The present disclosure provides a vibration device, as shown in FIGS. 1-2, including a housing 1 having accommodating space, a vibrator 3, a stator 2 and an elastic member 40. The elastic member 40 is configured to suspend the vibrator 3 in the accommodating space. The vibrator 3, the stator 2 and the elastic member 40 are all accommodated in the housing 1. The housing 1 includes a pair of first side walls 1111 symmetrically arranged along a long axis direction of the housing 1 and a pair of second side walls 1112 symmetrically arranged along a short axis direction.

The elastic member 40 is a sheet-like spring 4 arranged in a plane perpendicular to the vibrating direction of the vibrator 3. The spring 4 includes a first fixing portion 42 fixedly connected with the second side wall 1112, a second fixing portion 41 fixedly connected with the vibrator 3, and an N-shaped connecting portion 43 which connects the first fixing portion 42 with the second fixing portion 41 and extends along the short axis direction.

From the above contents, it is clear that, since the elastic member 40 is a sheet-like spring 4 provided in the plane perpendicular to the vibrating direction of the vibrator 3, the sheet-like spring 4 has a simple structure, which is easily formed and processed, and can be formed by directly punching. In specific assembling process, it is only necessary to simply weld the second fixing portion 41 of the spring 4 onto the vibrator 3, and weld the first fixing portion 42 onto the second side wall 1112, so that the assembling can be completed. Meanwhile, the stress applied by the spring 4 and subjected by the welding surface between the vibrator 3 and the spring 4 is eliminated, thereby reducing assembling difficulty. In addition, the spring 4 having such a structure does not occupy the vertical space in the vibrating direction of the vibrator 3, which improves space utilization and expands the magnetic circuit space. Moreover, the spring 4 can also be made in other manners other than punching, and an operator can select a specific processing manner according to the specific processing demands, which will not be illustrated in detail herein.

Specifically, in an exemplary embodiment, the housing 1 includes an upper cover plate 11 and a lower cover plate 12 connected with the upper cover plate 11. The upper cover plate 11 further includes an upper bottom plate 110 and a surrounding side wall 111 extending from the upper bottom plate 110 in a direction to the lower cover plate 12. The surrounding side wall 111 includes a pair of first side walls 1111 disposed symmetrically along a long axis direction of the surrounding side wall 111 and a pair of second side walls 1112 disposed symmetrically in the short axis direction thereof. The first fixing portion 42 is welded on an end surface of the surrounding side wall 1112 directly facing the lower cover plate 12.

In addition, it should be noted that, a protrusion 120 protrudes from the lower cover plate 12 in a direction to the upper cover plate 11. The protrusion 120 directly faces a lower end surface of the second side wall 1112 and extends into a slot 1110. Another end of the first fixing portion 42 is welded onto an upper end surface of the protrusion 120 directly facing the second side wall 1112, so that the first fixing portion 42 is fixed between the upper end surface of the protrusion 120 and the lower end surface of the second side wall 1112.

On the other hand, the vibrator 3 is suspended in the housing 1 by the elastic member 40 and vibrates along a direction perpendicular to the upper bottom plate 110. The stator 2 includes a coil 21, and the coil 21 is fixed on the lower cover plate 12. A printed circuit board (Printed Circuit Board, PCB) 6 is also provided between the coil 21 and the lower cover plate 12. The vibrator 3 includes a magnetic circuit unit. The magnetic circuit unit includes a magnetic conductor 31 having containing space, a main magnet 32 provided in the magnetic conductor 31, and a pole plate 33 attached to the main magnet 32. The coil 21 is arranged by winding the main magnet 32 and is spaced from the main magnet 32.

Obviously, the structure of the vibrator 3 is not limited to the above-described composition. It should be understood that, in the vibration device, any component that moves reciprocally in the housing 1 by the electromagnetic induction force between the coil 21 and the main magnet 32 can be regarded as the vibrator 3. It should be noted that, in the present embodiment, the second fixing portion 41 is welded onto the magnetic conductor 31.

It should be understood that, in an exemplary embodiment, each N-shaped connecting portion 43 includes a V-shaped arm 431, an arc arm 432, and a straight arm 433. The V-shaped arm 431 extends from the first fixing portion 42 in a direction to a side of the second fixing portion 41, the arc arm 432 bends from a tail end of the V-shaped arm 431 in a direction to the second fixing portion 41, and the straight arm 433 extends from a tail end of the arc arm 432 in a direction to the second fixing portion 41. It should be understood that, the arc arm 432 can be configured as a circular arc arm or an elliptic arc arm, an operator can make a selection based on the actual work demands, which will not be illustrated in detail herein. In addition, the opening angle of the V-shaped arm 431 and the opening angle of the arc arm 432 can be adjusted based on specific processing demands, so that the spring 4 can be easily processed.

In addition, with reference to FIG. 2, in an exemplary embodiment, a pair of N-shaped connecting portions 43 is provided. The first fixing portion 42 includes a central axis OO' perpendicular to the second side wall 1112, and the two N-shaped connecting portions 43 are arranged in axial symmetry with respect to the central axis OO' of the first fixing portion 42.

It should be noted that, in an exemplary embodiment, a pair of second fixing portions 41 is provided. The two second fixing portions 41 are also arranged in axial symmetry with respect to the central axis OO'. In this way, the symmetrical structure of the spring 4 allows the vibration of vibrator 3 to be more stable.

In addition, in an exemplary embodiment, the magnetic conductor 31 is spaced from the housing 1 to form interval space 5. The interval space 5 accommodates the N-shaped connecting portion 43 of the spring 4, so as to improve space utilization of the vibration device, and expand the magnetic circuit space.

Those skilled in the art shall understand that, the above embodiments are examples for implementing the present disclosure, in practical application, various modifications can be made without departing from the spirit and scope of the present disclosure.

What is claimed is:

1. A vibration device, comprising:
   a housing having accommodating space, the housing comprises a pair of first side walls and a pair of second side walls,
   a vibrator accommodated in the accommodating space,
   a stator accommodated in the accommodating space, and
   an elastic member, configured to suspend the vibrator in the accommodating space, the elastic member further comprises a sheet-like spring arranged perpendicular to a vibrating direction of the vibrator,
   wherein one of the vibrator and the stator comprises a magnetic circuit unit, and the other one of the vibrator and the stator comprises a coil,
   wherein, the pair of first side walls are symmetrically arranged along a long axis direction of the housing, and the pair of second side walls are symmetrically arranged in a short axis direction of the housing, and the spring comprises a first fixing portion fixedly connected with the housing, a second fixing portion fixedly connected with the vibrator, and an N-shaped connecting portion which connects the first fixing portion with the second fixing portion and extends along the short axis direction,
   wherein a pair of N-shaped connecting portions is provided and arranged in axial symmetry with respect to a central axis OO' of the first fixing portion,
   wherein a pair of the second fixing portions is provided and arranged in axial symmetry with respect to the central axis OO' of the first fixing portion.

2. The vibration device as described in claim 1, wherein the vibrator comprises the magnetic circuit unit, and the stator comprises the coil, the magnetic circuit unit comprises a magnetic conductor having containing space, a main magnet disposed in the magnetic conductor and a pole plate attached to the main magnet.

3. The vibration device as described in claim 2, wherein, the second fixing portion is fixedly connected with the magnetic conductor.

4. The vibration device as described in claim 1, wherein each N-shaped connecting portion comprises a V-shaped arm, an arc arm, and a straight arm, the V-shaped arm extends from the first fixing portion in a direction to a side of the second fixing portion, the arc arm bends from a tail end of the V-shaped arm to the second fixing portion, and the straight arm extends from a tail end of the arc arm in a direction to the second fixing portion.

5. The vibration device as described in claim 1, wherein the magnetic conductor and the housing are spaced from each other to form interval space, and the N-shaped connecting portion of the spring is accommodated in the interval space.

6. The vibration device as described in claim 1, wherein the housing comprises an upper cover plate and a lower cover plate connected with the upper cover plate, the upper cover plate is provided with an upper bottom plate and a surrounding side wall, the surrounding side wall extends from the upper bottom plate in a direction to the lower cover plate, the first fixing portion is fixed on an end surface of the surrounding side wall directly facing the lower cover plate.

7. The vibration device as described in claim 6, wherein, a protrusion extends from the lower cover plate in a direction to the upper cover plate, the protrusion directly faces the surrounding side wall, the first fixing portion is fixed between protrusion and the end surface of the surrounding side wall facing the lower cover plate.

8. The vibration device as described in claim 1, wherein the sheet-like spring is arranged in a plane perpendicular to a vibrating direction of the vibrator.

\* \* \* \* \*